US012628701B2

(12) United States Patent
Jang et al.

(10) Patent No.: US 12,628,701 B2
(45) Date of Patent: May 12, 2026

(54) SEMICONDUCTOR MEMORY MODULE AND COMPUTER SYSTEM INCLUDING THE SAME

(71) Applicant: SK hynix Inc., Icheon-si (KR)

(72) Inventors: In Seok Jang, Icheon-si (KR); Nam Hyeon Choi, Icheon-si (KR); Min Ho Park, Icheon-si (KR); Hyun Bae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 368 days.

(21) Appl. No.: 18/357,008

(22) Filed: Jul. 21, 2023

(65) Prior Publication Data

US 2024/0203959 A1     Jun. 20, 2024

(30) Foreign Application Priority Data

Dec. 19, 2022     (KR) ........................ 10-2022-0178395

(51) Int. Cl.
*H10W 90/00*          (2026.01)
*H10B 80/00*          (2023.01)
          (Continued)

(52) U.S. Cl.
CPC ............ *H10W 90/00* (2026.01); *H10B 80/00* (2023.02); *H10W 40/22* (2026.01); *H10W 70/685* (2026.01); *H10W 74/111* (2026.01); *H10W 90/701* (2026.01); *H10W 74/15* (2026.01); *H10W 90/722* (2026.01);
          (Continued)

(58) Field of Classification Search
CPC . H01L 25/105; H01L 23/3107; H01L 23/367; H01L 23/49811; H01L 23/49822; H01L 24/16; H01L 24/32; H01L 24/73; H01L 2224/16145; H01L 2224/16225; H01L 2224/32145; H01L 2224/32225; H01L 2224/73204; H01L 2924/1436; H01L 25/18; H01L 23/13; H01L 23/3736; H01L 23/473; H01L 25/0652; H01L 23/3185; H01L 23/49816; H01L 23/49827; H01L 23/49838; H01L 25/0655; H01L 25/0657;
          (Continued)

(56) References Cited

U.S. PATENT DOCUMENTS 7,737,549 B2     6/2010  Wehrly, Jr. et al.
7,760,513 B2     7/2010  Partridge et al.
          (Continued)

FOREIGN PATENT DOCUMENTS

KR     1020150135611 A     12/2015
KR     1020210001568 A     1/2021

*Primary Examiner* — Elias Ullah

(74) *Attorney, Agent, or Firm* — WILLIAM PARK AND ASSOCIATES LTD.

(57)          ABSTRACT

A semiconductor memory module includes a module substrate, a plurality of semiconductor devices, and a plurality of external terminals. The module substrate has opposite first and second surfaces. The semiconductor devices are mounted on a first region of at least one of the first and second surfaces in the module substrate. The external terminals are arranged in a second region of at least one of the first and second surfaces of the module substrate. A distance between the first surface and the second surface in the first region is shorter than a distance between the first surface and the second surface in the second region.

18 Claims, 10 Drawing Sheets

(51) Int. Cl.

| | |
|---|---|
| *H10W 40/22* | (2026.01) |
| *H10W 70/685* | (2026.01) |
| *H10W 74/10* | (2026.01) |
| *H10W 74/15* | (2026.01) |

(52) U.S. Cl.
CPC ........ *H10W 90/724* (2026.01); *H10W 90/732* (2026.01); *H10W 90/734* (2026.01)

(58) Field of Classification Search
CPC .......... H10B 80/00; G11C 5/04; G11C 5/025; G06F 3/0668; G06F 13/38
See application file for complete search history.

(56) References Cited

U.S. PATENT DOCUMENTS

| | | | |
|---|---|---|---|
| 10,410,950 B1 | 9/2019 | Pax | |
| 10,804,217 B2 | 10/2020 | Cho et al. | |
| 10,971,421 B1 | 4/2021 | He et al. | |
| 2012/0043669 A1* | 2/2012 | Refai-Ahmed | ... H01L 23/49827 |
| | | | 438/109 |
| 2020/0203254 A1* | 6/2020 | Dhane | .................. H01L 23/473 |

* cited by examiner

SEMICONDUCTOR MEMORY MODULE AND COMPUTER SYSTEM INCLUDING THE SAME

CROSS-REFERENCES TO RELATED APPLICATION

The present application claims priority under 35 U.S.C. § 119(a) to Korean application number 10-2022-0178395, filed on Dec. 19, 2022, in the Korean Intellectual Property Office, which is incorporated herein by reference in its entirety.

BACKGROUND

1. Technical Field

Various embodiments generally relate to a semiconductor memory module and a computer system including the same, and more particularly, to a semiconductor memory module having a thin thickness and a computer system including the semiconductor memory module.

2. Related Art

A semiconductor memory module including a semiconductor memory device may be applied to various electronic products.

The semiconductor memory modules applied to the various electronic products may include a printed circuit board (PCB) and a plurality of semiconductor devices or semiconductor memory devices mounted on at least one surface of the PCB.

However, when a computer system on which the semiconductor memory module may be mounted may be driven, the semiconductor devices in the semiconductor memory module may be simultaneously driven to generate high heat. The heat of the semiconductor devices may deteriorate performance of the semiconductor memory module. Thus, a modern semiconductor memory module may include a heat dissipation plate configured to effectively dissipate the heat. The heat dissipation plate may improve the performance of the semiconductor memory module. In contrast, the heat dissipation plate may also increase a thickness of the semiconductor memory module.

SUMMARY

An embodiment is directed to a semiconductor memory module having a thin thickness.

An embodiment is also directed to a computer system including the above-mentioned semiconductor memory module.

According to an embodiment, a semiconductor memory module may include a module substrate, a plurality of semiconductor devices, and a plurality of external terminals. The module substrate may have opposite first and second surfaces. The semiconductor devices may be mounted on a first region of at least one of the first and second surfaces in the module substrate. The external terminals may be arranged in a second region of at least one of the first and second surfaces of the module substrate. A distance between the first surface and the second surface in the first region may be shorter than a distance between the first surface and the second surface in the second region.

In an embodiment, each of the semiconductor devices may include a plurality of memory components including at least one memory chip. At least one of the memory components may be arranged at a side of the memory chip to expose an uppermost memory chip.

In an embodiment, each of the semiconductor devices may include a plurality of memory components, at least one driving component and at least one temperature sensor. Each of the memory components may include at least one semiconductor chip. The driving component may include at least one semiconductor chip. The temperature sensor may detect temperatures of the memory components and the driving component. At least one of the memory components and the driving component may include an exposed uppermost semiconductor chip. The semiconductor memory module may further include a heat dissipation plate configured to contact uppermost semiconductor chips of the exposed memory component and uppermost semiconductor chips of the exposed driving component.

According to an embodiment, a semiconductor memory module may include a module substrate, a plurality of semiconductor packages and a heat dissipation plate. The module substrate may have first and second surfaces. A plurality of circuit patterns may be arranged between the first surface and the second surface. A plurality of vertical conductive paths having different lengths may be formed between the first surface and the second surface. The semiconductor packages may be mounted on a first region of at least one of the first and second surfaces in the module substrate. Each of the semiconductor packages may include an exposed semiconductor chip. The heat dissipation plate may be attached to at least one of the first and second surfaces of the module substrate. The heat dissipation plate may physically contact the exposed semiconductor chips of the semiconductor packages.

In an embodiment, the semiconductor memory module may further include a plurality of first external terminals and a plurality of second external terminals. The first external terminals may be arranged in one edge region on the first surface of the module substrate. The second external terminals may correspond to the first external terminals. The second external terminals may be arranged on one edge region on the second surface of the module substrate. The shortest length among a plurality of vertical conductive paths may be shorter than a distance between the first external terminal and the second external terminal.

In an embodiment, the module substrate on which the semiconductor packages may be mounted may have a thickness thinner than a thickness of a module substrate on which the first external terminals and the second external terminals may be arranged.

According to an embodiment, a computer system may include a central processing unit (CPU), a plurality of module connectors and a thin semiconductor memory module. The CPU may be mounted on a main board. The module connectors may be installed at the CPU. A plurality of semiconductor devices may be mounted on a surface of the semiconductor memory module. The semiconductor memory module may have an edge region mounted on each of the module connectors. The semiconductor memory module may include a module substrate. The module substrate may have a region where the semiconductor devices may be mounted and the edge region. The region may have a thickness thinner than a thickness of the edge region.

According to an embodiment, at least one of the module substrate and the semiconductor devices may have a thin thickness to manufacture the thin semiconductor memory module. Thus, although numbers of the semiconductor memory modules on the computer system may be increased, a sufficient gap through which a cooling fluid may flow may be secured between the semiconductor memory modules. As a result, a great amount of the semiconductor memory modules having desired performances may be mounted on a main board having a restricted area.

BRIEF DESCRIPTION OF THE DRAWINGS

The above and other aspects, features, and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the presented concepts. Although a few embodiments of the present teachings will be shown and described, it will be appreciated by those of ordinary skill in the art that changes may be made in these embodiments without departing from the principles and spirit of the present teachings.

Hereinafter, example embodiments are described in detail with reference to accompanying drawings.

Figure 1:
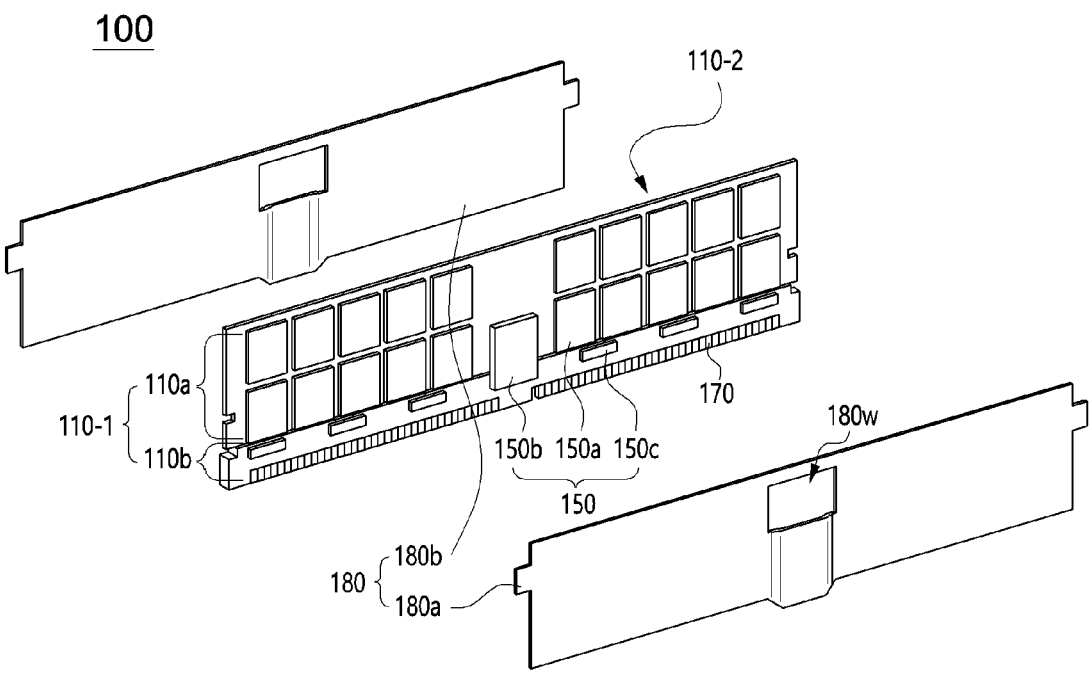
FIG. 1 is an exploded perspective view illustrating a semiconductor memory module in accordance with an embodiment.
Figure 2:
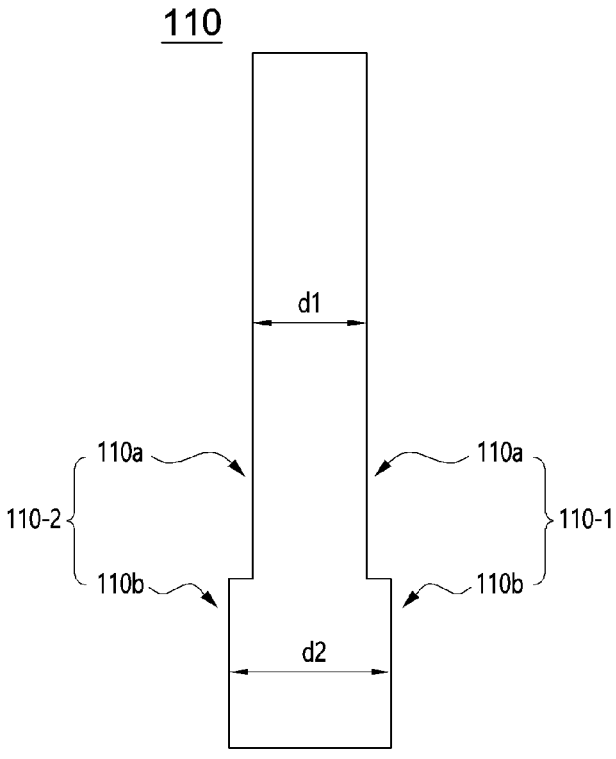
FIG. 2 is a side view illustrating a module substrate in accordance with an embodiment.
Figure 3:
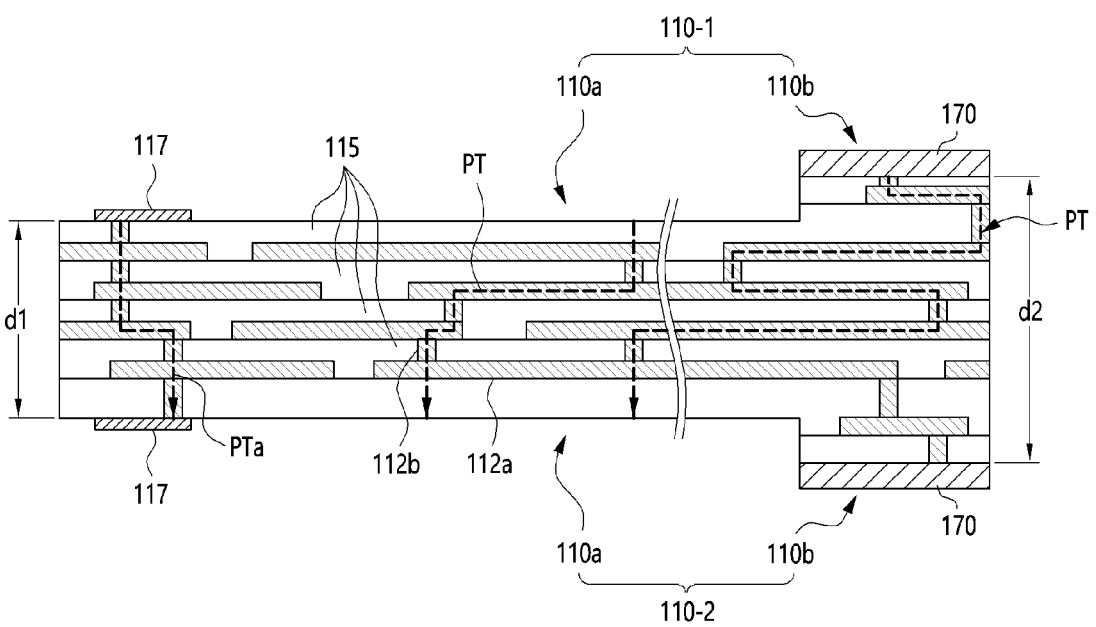
FIG. 3 is a cross-sectional view illustrating a module substrate in accordance with an embodiment.

FIG. 1 is an exploded perspective view illustrating a semiconductor memory module in accordance with an embodiment, FIG. 2 is a side view illustrating a module substrate in accordance with example embodiments, and FIG. 3 is a cross-sectional view illustrating a module substrate in accordance with an embodiment.

Referring to FIG. 1, a semiconductor memory module 100 may include a module substrate 110, a plurality of semiconductor devices 150, and a heat dissipation plate 180.

The module substrate 110 may have different thicknesses by regions. For example, as shown in FIGS. 2 and 3, the module substrate 110 may have a first surface 110-1 and a second surface 110-2 opposite to each other. At least one of the first surface 110-1 and the second surface 110-2 of the module substrate 110 may include a first region 110a and a second region 110b. The first region 110a may correspond to a region where the semiconductor devices 150 may be mounted. The second region 110b may correspond to one edge region of the module substrate 110. A plurality of external terminals 170 connected to a module connector may be arranged in the second region 110b. The external terminals 170 may be formed on at least one of the first surface 110-1 and the second surface 110-2. When the external terminals 170 are arranged on the first surface 110-1 and the second surface 110-2 of the module substrate 110, respectively, a plurality of first external terminals 170 on the first surface 110-1 may correspond to a plurality of second external terminals 170 on the second surface 110-2.

In an embodiment, when the semiconductor devices 150 are mounted on any one of the first surface 110-1 and the second surface 110-2 of the module substrate 110, the semiconductor memory module 100 may correspond to a single in-line memory module (SIMM). In contrast, when the semiconductor devices 150 are mounted on all of the first surface 110-1 and the second surface 110-2 of the module substrate 110, the semiconductor memory module 100 may correspond to a dual in-line memory module (DIMM).

In an embodiment, the first region 110a of the module substrate 110 may have a thickness d1. The second region 110b of the module substrate 110 may have a thickness d2. The thickness d1 may be thinner than the thickness d2. That is, the thickness d1 of the first region 110a of the module substrate 110 where the semiconductor devices 150 may be mounted may be thinner than the thickness d2 of the second region 110b of the module substrate 110 where the external terminals 170 may be arranged. For example, the thickness d1 of the first region 110a may be about 30% to about 70% of the thickness d2 of the second region 110b. The thicknesses d1 and d2 may be a distance between the first surface 110-1 and the second surface 110-2.

The module substrate 110 may include a printed circuit board (PCB) including a plurality of circuit patterns 112 for providing various conductive paths. In an embodiment, the module substrate 110 may include a plurality of the circuit patterns 112 and the insulating interlayers 115. The insulating interlayers 115 may be configured to electrically isolate the circuit patterns 112 from each other. The circuit patterns 112 may include horizontal circuit patterns 112a and vertical circuit patterns 112b. For example, the insulating interlayers 115 may be interposed between the horizontal circuit patterns 112a. For example, the insulating interlayers 115 may be interposed between the horizontal circuit patterns 112a. The vertical circuit patterns 112b may be formed through the insulating interlayers 115. The vertical circuit patterns 112b may be configured to connect the adjacent horizontal circuit patterns 112a between which the insulating interlayers 115 may be interposed. Thus, vertical conductive paths PT may be formed in the module substrate 110. The vertical conductive paths PT may have various lengths. Further, the vertical conductive paths PT may be substantially perpendicular to the first surface 110-1 or the second surface 110-2.

Signals provided through the external terminals 170 may be transmitted to an external conductive pattern 117 on the first surface 110-1 or the second surface 110-2 of the module substrate 110 through the vertical conductive paths PT. For example, the external conductive pattern 117 may include a conductive pad or a redistribution layer.

In an embodiment, a vertical conductive path PTa among the vertical conductive paths PT in the first region 110a may have the shortest length. The vertical conductive path PTa may have a length less than the thickness d2 of the second region 110b, i.e., a distance between the external terminal 170 on the first surface 110-1 and the external terminal 170 on the second surface 110-2.

The semiconductor devices 150 may include at least one semiconductor chip or die. A part of the semiconductor devices 150 may include the semiconductor chip having a partially exposed portion.

In an embodiment, as shown in FIGS. 2 and 3, the semiconductor devices 150 may be mounted on the first region 110a of at least one of the first and second surfaces 110-1 and 110-2 of the module substrate 110. The semiconductor devices 150 may include memory components 150a. Additionally, the semiconductor devices 150 may further include a driving component 150b and a temperature sensor 150c. The driving component 150b may include a power management integrated circuit (PMIC), a register clock driver (RCD), etc. The memory components 150a, the driving component 150b and the temperature sensor 150c may be formed in a semiconductor package including at least one semiconductor chip.

In an embodiment, the driving component 150b may be mounted on a central portion of the first region 110a of the first and second surfaces 110-1 and 110-2. The memory components 150a may be positioned at both sides of the driving component 150b. The temperature sensor 150c may be arranged in the first region 110a adjacent to the second region 110b, but is not limited thereto. Functions, numbers, positions, arrangements, etc., of the semiconductor devices 150 may be variously changed.

In an embodiment, the driving component 150b may control the memory components 150a mounted on a same surface. The temperature sensor 150c may measure temperatures of the adjacently mounted memory components 150a. The temperature sensor 150c may then provide a controller with the measured temperatures.

Further, at least one of the semiconductor chips in the memory components 150a may include a memory chip such as a DRAM chip.

Figure 4A:
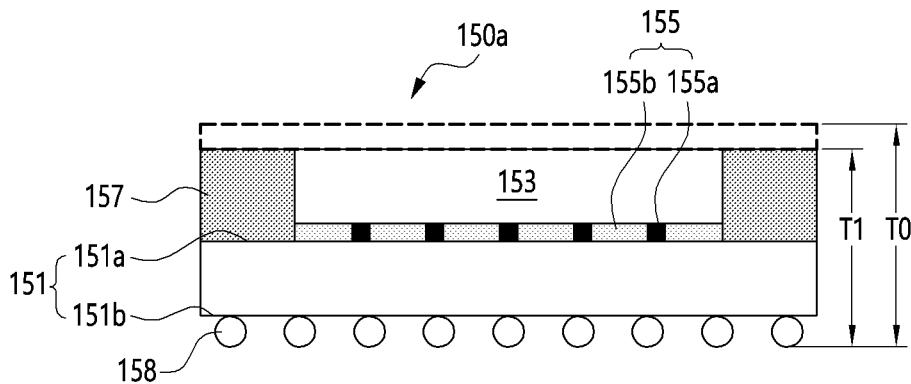
FIGS. 4A to 4C are cross-sectional views illustrating memory components in accordance with an embodiment.
Figure 4B:
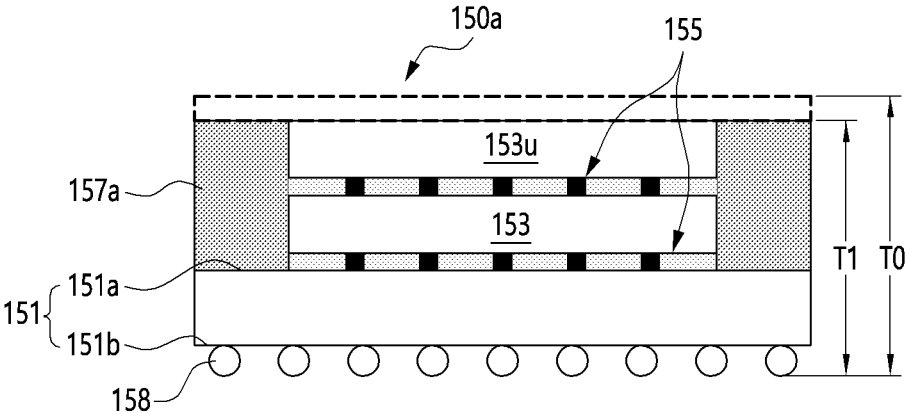
Figure 4C:
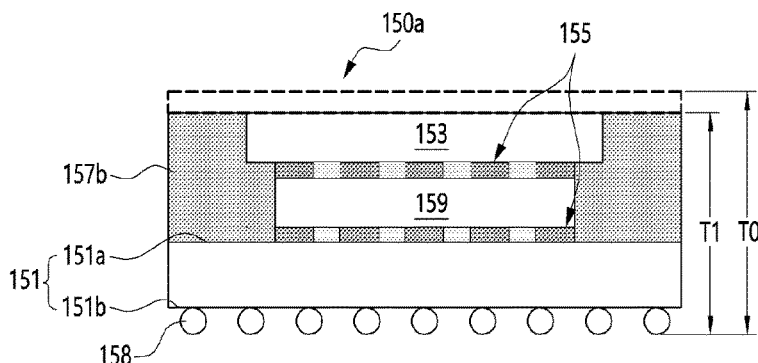

FIGS. 4A to 4C are cross-sectional views illustrating memory components in accordance with an embodiment.

Referring to FIG. 4A, each of the memory components 150a may include a package substrate 151, at least one memory chip 153, and a molding layer 157.

The package substrate 151 may include an upper surface 151a and a lower surface 151b. Although not depicted in drawings, the package substrate 151 may include a plurality of conductive paths configured to electrically connect the upper surface 151a and the lower surface 151b with each other.

The memory chip 153 may be boned to the upper surface 151a of the package substrate 151 by a conductive connection member 155. The memory chip 153 may include a DRAM chip, but is not limited thereto.

The conductive connection member 155 may be physically electrically connected between the memory chip 153 and the package substrate 151. In an embodiment, the conductive connection member 155 may include a conductive bump 155a and an adhesive 155b. The conductive bump 155a may be electrically connected between a bonding pad of the memory chip 153 and a conductive pad of the package substrate 151. The conductive connection member 155 may include the conductive bump 155a, but is not limited thereto.

The molding layer 157 may be formed on the upper surface 151a of the package substrate 151 to protect and fix the memory chip 153. The molding layer 157 may include a resin.

The molding layer 157 may surround side surfaces of the memory chip 153 to expose an upper surface of the memory chip 153. Thus, the molding layer 157 may have a thickness substantially equal to or less than a thickness of the memory chip 153. As a result, the upper surface of the memory chip 153 in the memory component 150a may be exposed.

The memory component 150a may further include a plurality of external terminals 158 arranged on the lower surface 151b of the package substrate 151. The external terminals 158 may include solder balls. The external terminals 158 may receive a signal from the module substrate 110. The external terminals 158 may then transmit the signal to the memory chip 153 through the package substrate 151 and the conductive connection member 155.

Referring to FIG. 4B, the memory chip 153 may include a plurality of chips. The memory chips 153 may be stacked through the conductive connection member 155. The thickness of the molding layer 157 may allow an upper surface of an uppermost memory chip 153u to be exposed.

Referring to FIG. 4C, a semiconductor chip 159 may be interposed between the upper surface 151a of the package substrate 151 and the memory chip 153. The semiconductor chip 159 may have a kind and/or a size different from a kind and/or a size of the memory chip 153. For example, the semiconductor chip 159 may include a master chip having a kind different from the kind of the memory chip 153, but is not limited thereto. The memory chip 153, the semiconductor chip 159 may be electrically connected with each other by the conductive connection member 155. The semiconductor chip 159 and the package substrate 151 may be electrically connected with each other through the conductive connection member 155. The thickness of the molding layer 157 may allow an upper surface of the molding layer 157 positioned lower than an upper surface of an uppermost chip, for example, the memory chip 153.

In FIGS. 4B and 4C, the uppermost chip may correspond to the memory chip 153, but is not limited thereto. That is, the uppermost chip may include other kinds of semiconductor chips.

Generally, a molding layer of a semiconductor package may surround side surfaces of an upper surface of a semiconductor chip. However, according to an embodiment, the molding layer 157, 157a, and 157b of the memory component 150a may be configured to expose the upper surface of the semiconductor chip to reduce a total thickness of the memory component 150a. A reference numeral T0 may be a thickness of a general memory component. A reference numeral T1 may be the thickness of the memory component 150a of an embodiment.

Further, FIGS. 4A to 4C may show the memory component 150a, but are not limited thereto. For example, an uppermost chip in the driving component 150b may be exposed through the molding layer.

Referring again to FIG. 1, the heat dissipation plate 180 may be attached to at least one of the first surface 110-1 and the second surface 110-2 of the module substrate 110.

In an embodiment, the heat dissipation plate 180 may include a first heat dissipation plate 180a and a second heat dissipation plate 180b. The first heat dissipation plate 180a may be configured to cover the semiconductor devices 150 on the first surface 110-1 of the module substrate 110. The second heat dissipation plate 180b may be configured to cover the semiconductor devices 150 on the second surface 110-2 of the module substrate 110.

The first heat dissipation plate 180a and the second heat dissipation plate 180b may have substantially the same structure. Alternatively, the first heat dissipation plate 180a and the second heat dissipation plate 180b may have different structures. The structures of the first and second heat dissipation plates 180a and 180b may be changed in accordance with the arrangements of the semiconductor devices 150.

Figure 5:
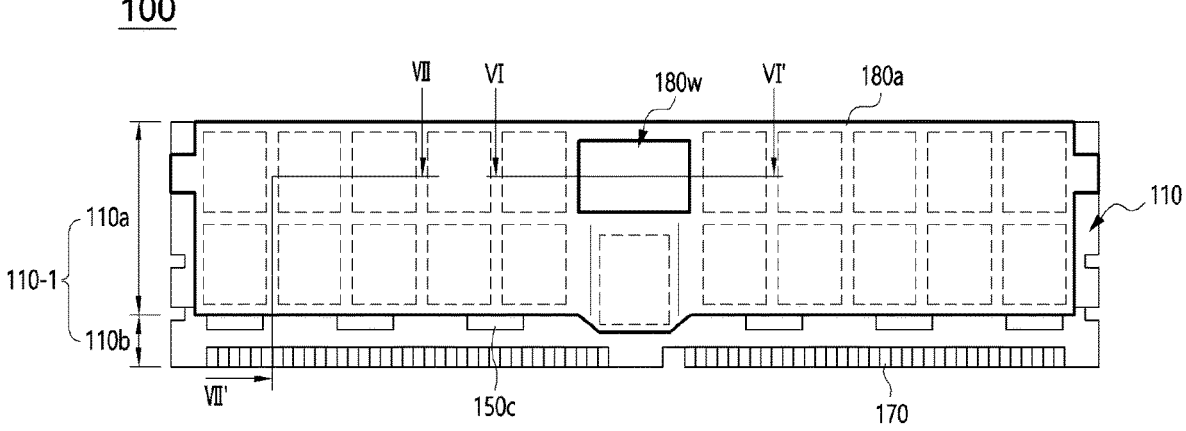
FIG. 5 is a plan view illustrating a semiconductor memory module with a heat dissipation plate in accordance with an embodiment.
Figure 6:
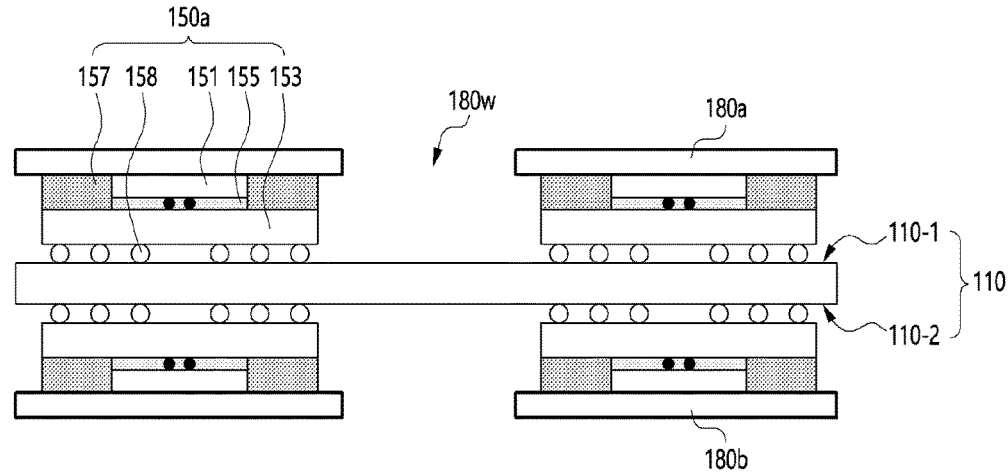
FIG. 6 is a cross-sectional view taken along a line VI-VI' in FIG. 5.
Figure 7A:
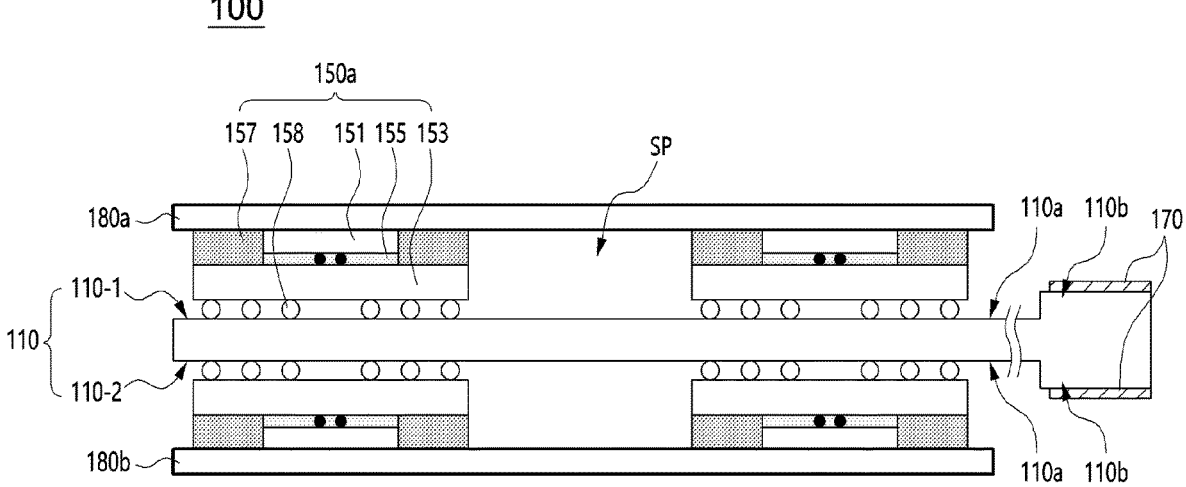
FIG. 7A is a cross-sectional view taken along a line VII-VII' in FIG. 5.
Figure 7B:
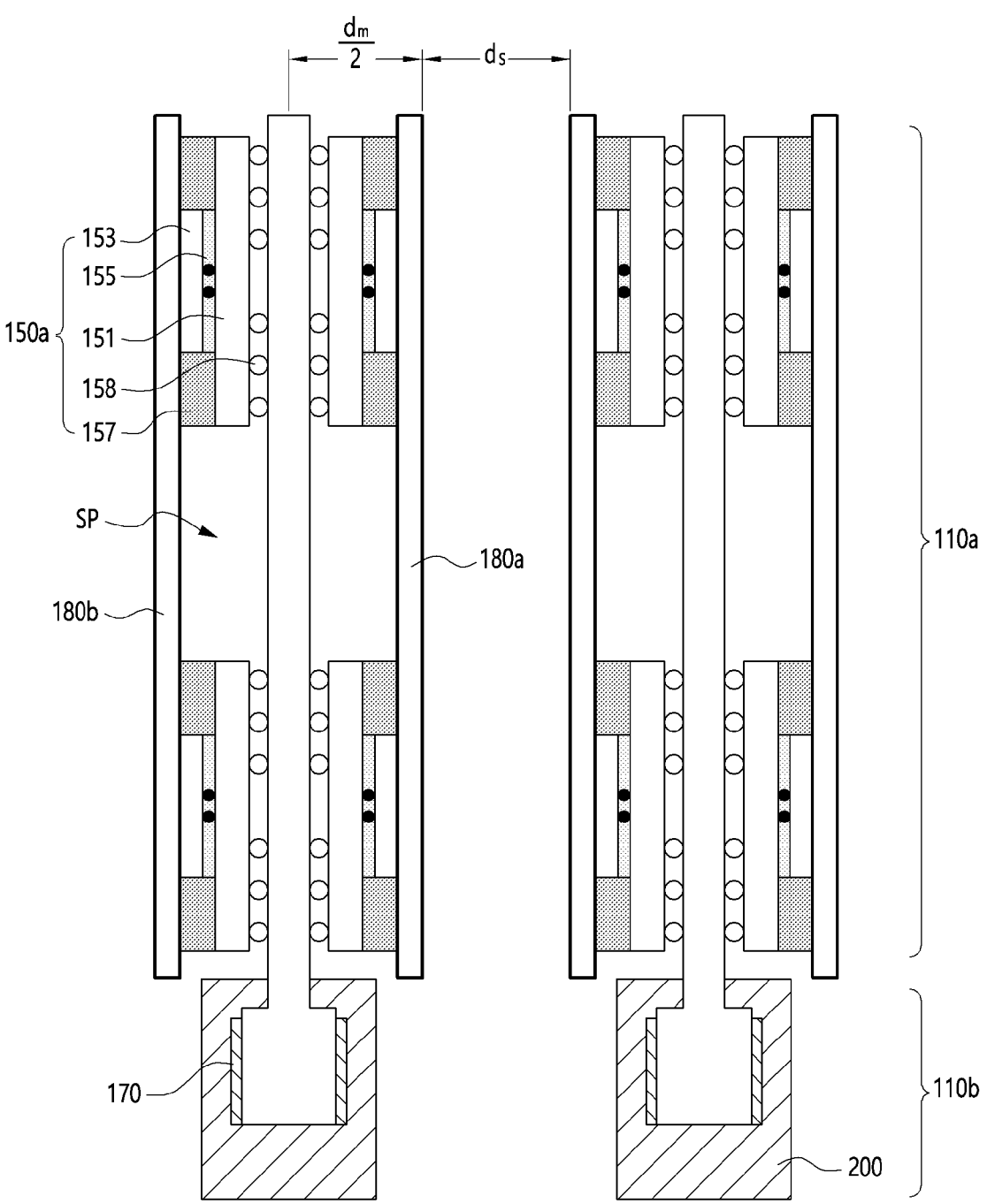
FIG. 7B is a side view illustrating the semiconductor memory modules in FIG. 3.

FIG. 5 is a plan view illustrating a semiconductor memory module with a heat dissipation plate in accordance with an embodiment, FIG. 6 is a cross-sectional view taken along a line VI-VI' in FIG. 5, FIG. 7A is a cross-sectional view taken along a line VII-VII' in FIG. 5, and FIG. 7B is a side view illustrating the semiconductor memory modules in FIG. 3.

Referring to FIGS. 5 to 7B, the semiconductor devices 150 may be mounted on the first region 110a of the first and second surfaces 110-1 and 110-2 in the module substrate 110. The semiconductor devices 150 may be spaced apart from each other by a set gap.

The thickness of the first region 110a of the module substrate 110 where the semiconductor devices 150 may be mounted may be thinner than the thickness of the second region 110b where the external terminals 170 may be arranged.

The memory components 150a on the first surface 110-1 of the module substrate 110 and the memory components 150a on the second surface 110-2 of the module substrate 110 may have arrangements correspond to each other to share a same kind of a signal.

The first heat dissipation plate 180a may be attached to the first surface 110-1 of the module substrate 110. The second heat dissipation plate 180b may be attached to the second surface 110-2 of the module substrate 110. For example, the first and second heat dissipation plates 180a and 180b may be positioned in the first region 110a of the first and second surfaces 110-1 and 110-2.

For example, the first and second heat dissipation plates 180a and 180b may cover the memory component 150a and the driving component 150b among the semiconductor devices 150 on the first and second surfaces 110-1 and 110-2. The first and second heat dissipation plates 180a and 180b may include at least one metal layer having a high thermal conductivity. The first and second heat dissipation plates 180a and 180b may include at least one window 180w. The window 180w may be configured to expose a portion where the semiconductor device 150 might not be mounted, for example, a portion of the module substrate 110.

The window 180w may be positioned at central portions of the first and second heat dissipation plates 180a and 180b. Alternatively, the window 180w may be arranged with the driving component 150b side by side. In this case, the window 180w may be positioned between the memory components 150a.

The temperature sensors 150c may accurately measure the temperatures of the elements in the semiconductor memory module 100. Thus, the temperature sensors 150c may be located at positions independently upon the first and second heat dissipation plates 180a and 180b causing the temperature change.

In an embodiment, the first and second heat dissipation plates 180a and 180b may include a metal plate. When the first heat dissipation plate 180a includes the metal plate, the first heat dissipation plate 180a may simultaneously contact the uppermost semiconductor chips 153 of the memory components 150a and/or the uppermost semiconductor chip of the driving component 150b. A space SP may be formed between the memory components 150a and between the memory component 150a and the driving component 150b.

When the cooling fluid is supplied, the cooling fluid may be transferred to the spaces SP through an opening of the first heat dissipation plate 180a to effectively cool the semiconductor chips.

Because the molding layer 157 in the semiconductor package includes the resin, the molding layer 157 may have an adiabatic characteristic. Thus, in the molding layer configured to surround the side surfaces and the upper surface of the semiconductor chip, the heat generated by the driven semiconductor chip may be restrained in the molding layer, particularly, a portion of the molding layer over the semiconductor package to increase a thermal resistance of the molding layer. Therefore, when a heat dissipation plate is attached to the upper surface of the general package, a residual heat frequency may be high and a burden of the thickness of the semiconductor memory module may be increased.

In contrast, according to an embodiment, a part of the semiconductor devices 150, for example, the portion of the molding layer on the memory component 150a and/or the driving component 150b may be removed to reduce the thickness of the semiconductor devices 150.

The first heat dissipation plate 180a or the second heat dissipation plate 180b may physically contact the uppermost semiconductor chip of the memory component 150a, for example, the memory chip 153 and/or the uppermost semiconductor chip of the driving component 150b. Thus, the heat generated by the semiconductor chips 153 may be directly transferred to the first and second heat dissipation plates 180a and 180b, not through the molding layer, to improve heat distribution efficiency.

In an embodiment, the first and second heat dissipation plates 180a and 180b may have the same structure. Alternatively, the structure of the first and second heat dissipation plates 180a and 180b may be changed into each other.

In an embodiment, to effectively flow the cooling fluid between the semiconductor memory modules 100, a gap ds between the semiconductor memory modules 100 may be greater than a half of a width of the semiconductor memory module 100.

Figure 8:
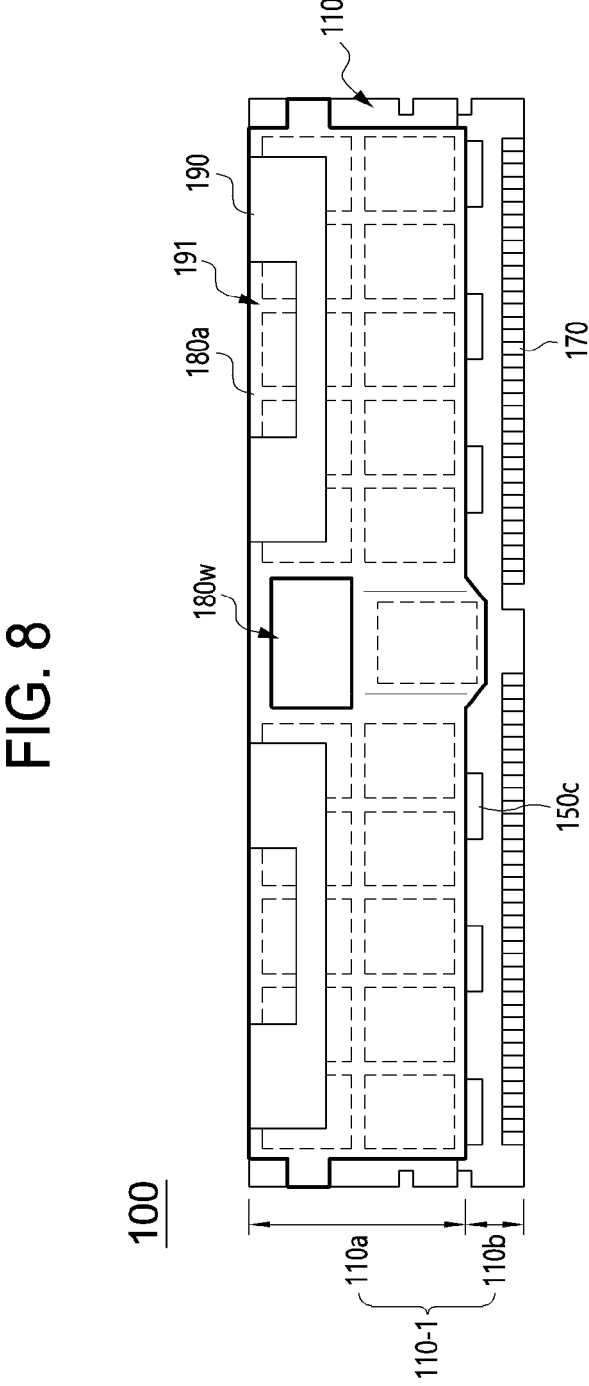
FIG. 8 is a plan view illustrating a semiconductor memory module in accordance with an embodiment.

FIG. 8 is a plan view illustrating a semiconductor memory module in accordance with an embodiment.

Referring to FIG. 8, the semiconductor memory module 100 may further include a fixing member 190. The fixing member 190 may fix the first heat dissipation plate 180a to the first surface 110-1 of the module substrate 110. When the semiconductor memory module 100 may be the DIMM, the fixing member 190 may fix the first heat dissipation plate 180a, the module substrate 110 and the second heat dissipation plate 180b. The fixing member 190 may include a flexible material to fix the first heat dissipation plate 180a, the module substrate 110, and the second heat dissipation plate 180b in a clip shape. Further, the fixing member 190 may include a conductive material having heat distribution capacity similarly to the first and second heat dissipation plates 180a and 180b. The fixing member 190 may have a thin thickness having no influence on the thickness of the semiconductor memory module 100. The fixing member 190 may have an opening 191 configured to expose the first and second heat dissipation plates 180a and 180b to the cooling fluid.

Figure 9:
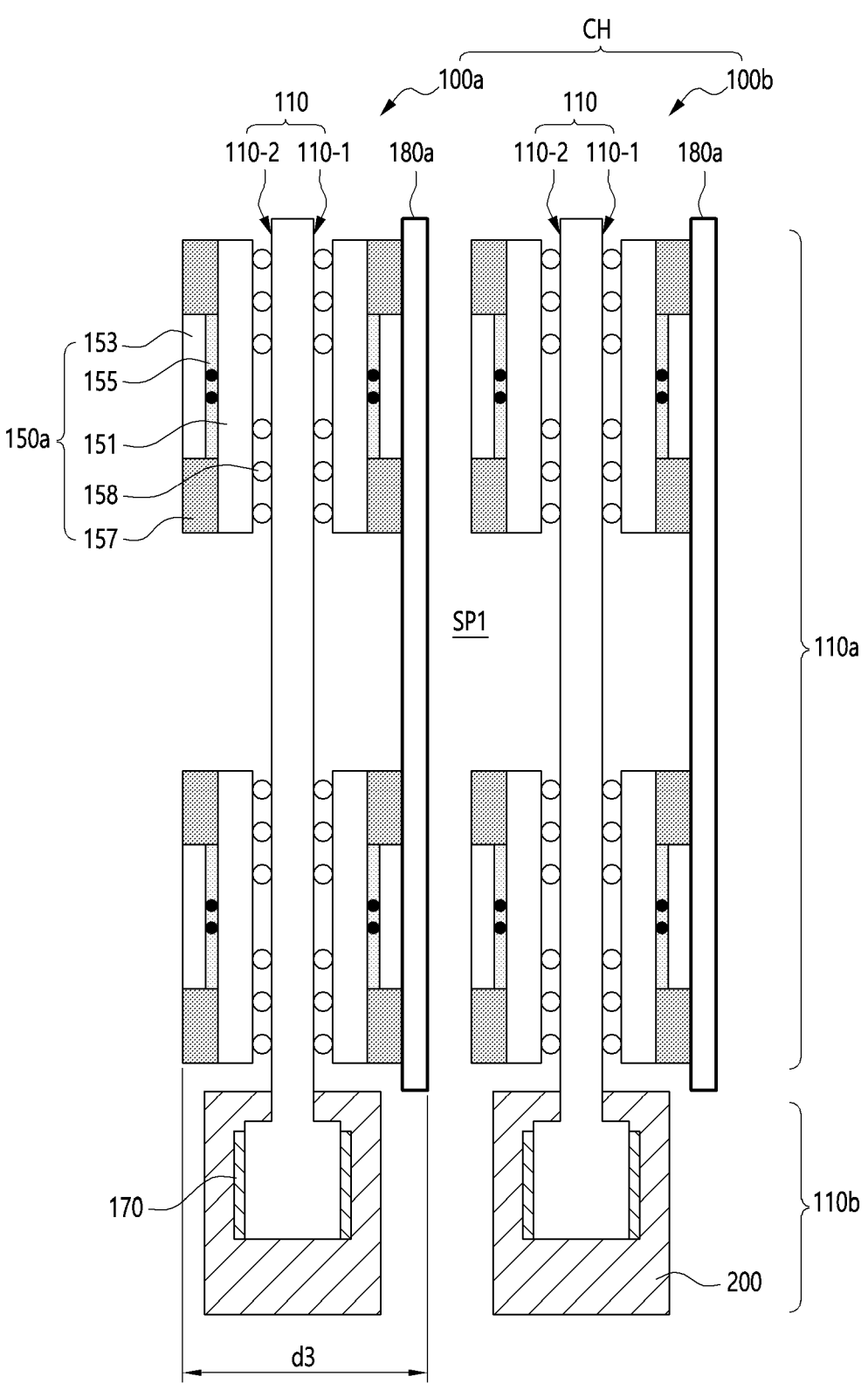
FIG. 9 is a side view illustrating a semiconductor memory module in accordance with an embodiment.

FIG. 9 is a side view illustrating a semiconductor memory module in accordance with an embodiment.

Referring to FIG. 9, a heat dissipation plate may be attached to any one of the first surface 110-1 and the second surface 110-2 of each of first and second semiconductor memory modules 100a and 100b. Hereinafter, the first heat dissipation plate 180a attached to the first surface 110-1 of the module substrate 110 is described.

As shown in FIGS. 4A to 7, the first heat dissipation plate 180a may contact a part of the semiconductor chips of the semiconductor devices 150 on the first surface 110-1 to dissipate the heat.

For example, the first heat dissipation plate 180a of the first semiconductor memory module 100a may dissipate the heat generated by the semiconductor devices 150 directly contacting the first heat dissipation plate 180a. Further, the first heat dissipation plate 180a may indirectly dissipate the heat generated by the semiconductor devices 150 on the second surface 110-2 of the second semiconductor memory module 100b through the cooling fluid.

In an embodiment, the cooling fluid may flow through a space SP1 between the first semiconductor memory module 100a and the second semiconductor memory module 100b. The first heat dissipation plate 180a may control the flow of the cooling fluid with the heat dissipation of the first semiconductor memory module 100a. That is, the first heat dissipation plate 180a may control the flow of the cooling fluid to contribute the cooling of the second surface 110-2 of the second semiconductor memory module 100b without the heat dissipation plate.

According to an embodiment, the heat dissipation plate may be selectively provided to one surface of the semiconductor memory modules 100a and 100b to reduce the thickness d3 of the semiconductor memory module by a thickness of the heat dissipation plate. To readily transfer the cooling fluid between the semiconductor memory modules 100a and 100b, the gap between the semiconductor memory modules 100a and 100b may be greater than a half of the width of the semiconductor memory module 100a or 100b.

Figure 10:
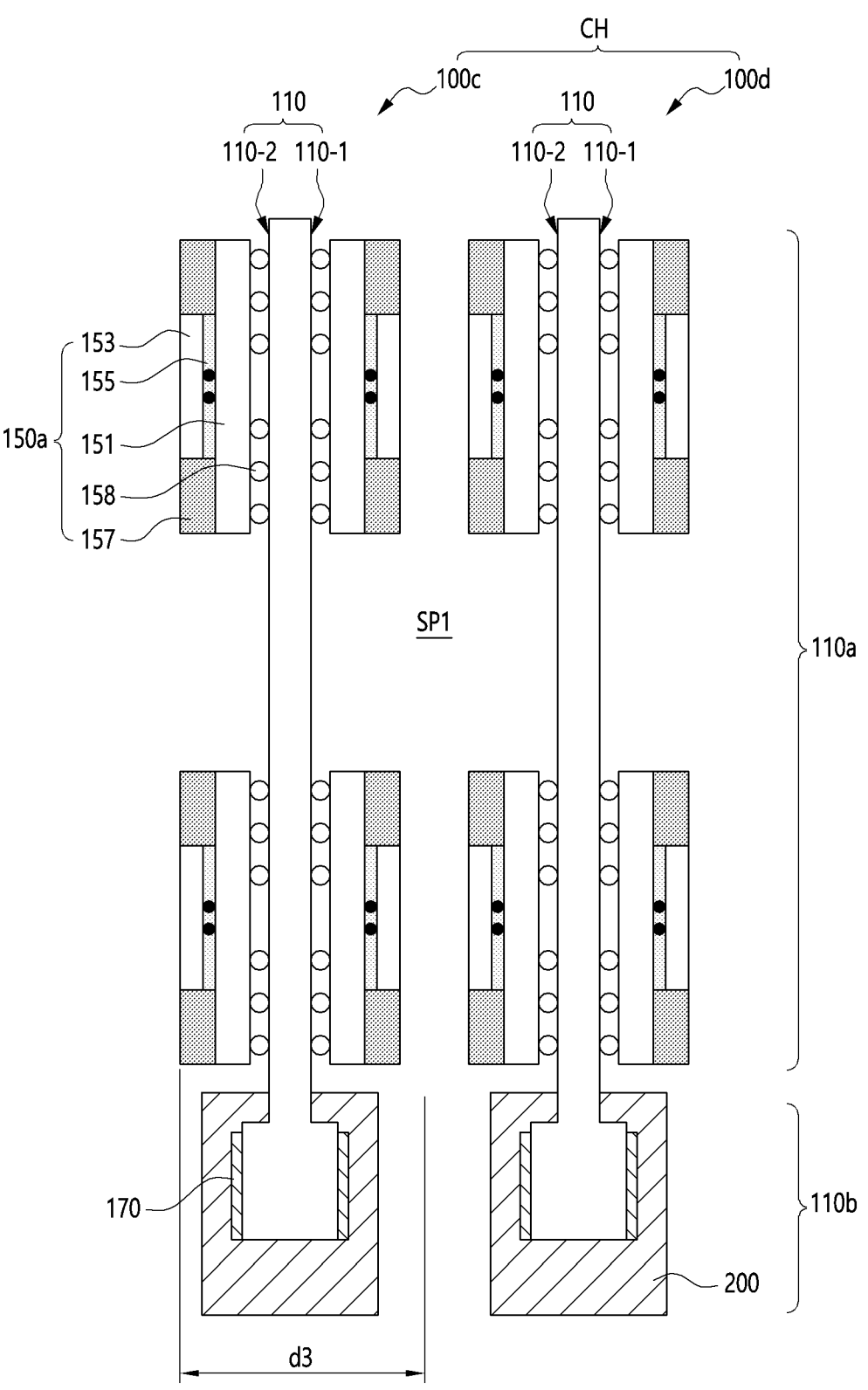
FIG. 10 is a side view illustrating a semiconductor memory module in accordance with an embodiment.

FIG. 10 is a side view illustrating a semiconductor memory module in accordance with an embodiment.

Referring to FIG. 10, the semiconductor devices 150 may be mounted on the first region 110a of the first and second surfaces 110-1 and 110-2 in first and second semiconductor memory modules 100c and 100d. The second region 110b may be fixed to each of the module connectors 200.

In an embodiment, the part of the semiconductor devices 150, for example, the memory component 150a and the driving component 150b may be mounted on the module substrate 110. The memory component 150a and the driving component 150b may include the exposed uppermost semiconductor chips.

The first and second semiconductor memory modules 100c and 100d might not include a heat dissipation plate on both surfaces. The first and second semiconductor memory modules 100c and 100d may be inserted into the module connector 200.

Because the first and second semiconductor memory modules 100c and 100d might not include the heat dissipation plate, the thickness d3 of the semiconductor memory module may be more decreased.

Further, because the semiconductor chip 153 as a heat source of the semiconductor devices 150 is directly exposed to the cooling fluid, the cooling efficiency of the memory component 150a and the driving component 150b may be improved.

To readily provide the cooling fluid to the space between the semiconductor memory modules 100c and 100d, the gap between the semiconductor memory modules 100c and 100d may be greater than a half of the width of the semiconductor memory module 100c or 100d.

Figure 11:
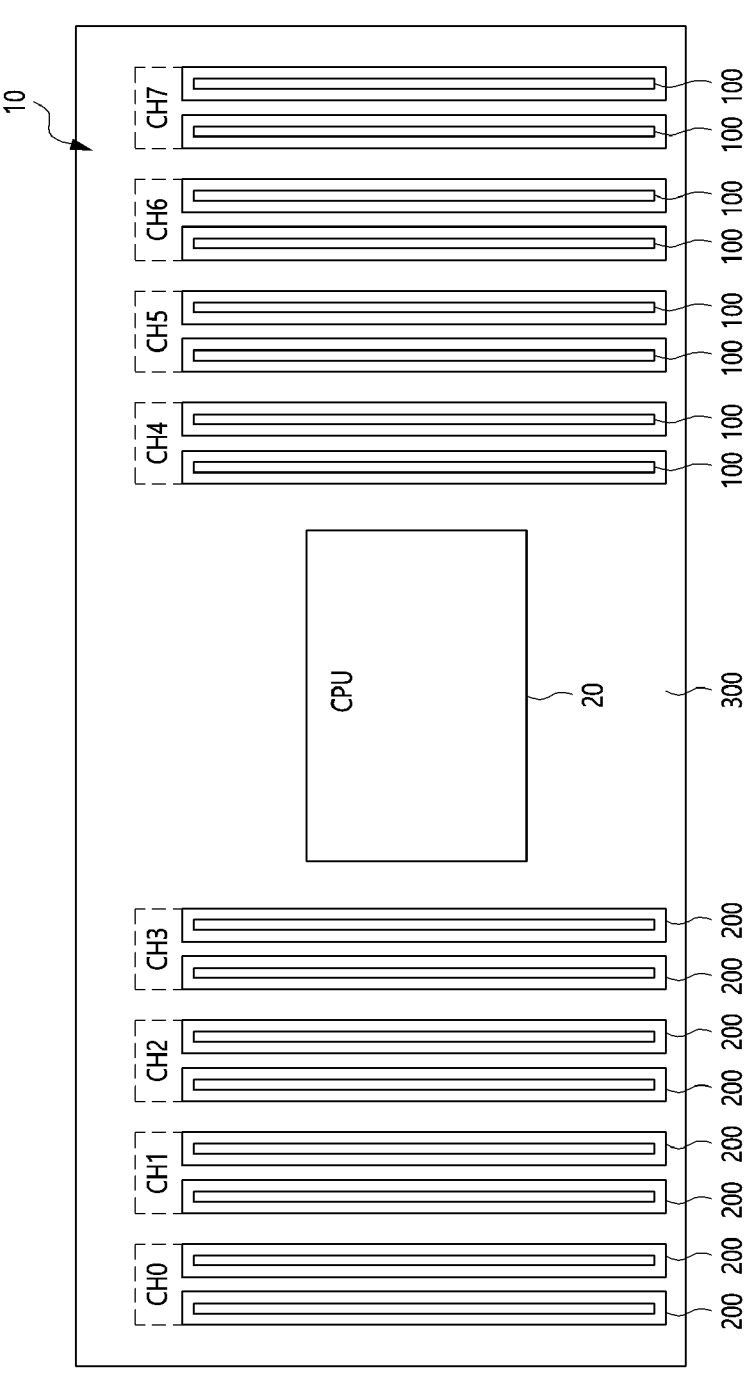
FIG. 11 is a block diagram illustrating a computer system in accordance with an embodiment.

FIG. 11 is a block diagram illustrating a computer system in accordance with an embodiment.

Referring to FIG. 11, a computer system 10 of an embodiment may include a main board 300, a central processing unit (CPU) 20, a plurality of module connectors 200, and semiconductor memory modules 100 having a thin thickness.

Basic circuits and parts of the computer system 10 may be mounted on the main board 300. The main board 300 may be basic hardware configured to perform stable drives, data input/outputs, and information storage.

The CPU 20 may be mounted on the main board 300 to control the basic circuits and the parts, and the data input/output and the storage of the semiconductor memory modules 100.

The module connectors 200 may be installed at the main board 300 at both sides of the CPU 20. Each of the module connectors 200 may be configured to receive the semiconductor memory module 100. For example, the module connectors 200 having a same number may be arranged parallel to each other with respect to the CPU 20. The module connector 200 may be physically and electrically connected to the main board 300.

Each of the semiconductor memory modules 100 may be inserted into the module connector 200. In an embodiment, the edge region of the semiconductor memory module 100 may be inserted into the module connector 200. The rest region of the semiconductor memory module 100 may be spaced apart from the module connector 200.

The adjacent semiconductor memory modules 100 may be connected with each other to share a command and an address for operating the computer system 10. A unit of the adjacent semiconductor memory modules 100 may be referred to as a channel CH0~CH7.

Recently, as storage capacity of the computer system may have been increased, a rapid data processing speed may be required. Thus, it may be required to mount a lot of the channels CH, i.e., the semiconductor memory modules on the main board under controls of the CPU.

However, because high-power parts having various functions as well as the CPU and the semiconductor memory modules may be mounted on the main board, when numbers of the semiconductor memory modules on the restricted area of the main board may be increased, a gap between the semiconductor memory modules may be narrowed.

The gap between the semiconductor memory modules may correspond to the cooling passage of the computer system. As well-known, the semiconductor memory modules with the main board and the parts may generate the heat in operating the computer system. The heat may deteriorate performances of the parts. Thus, when the computer system is operated, the cooling may be simultaneously operated. However, because the sufficient gap is not formed between the semiconductor memory modules, the cooling fluid might not smoothly flow between the narrow gap, although the cooling may be performed, the performances of the semiconductor memory modules may be decreased.

According to an embodiment, the computer system 10 may include the thin semiconductor memory modules 100.

Thus, although the number of the semiconductor memory modules 100 may be increased, the cooling passage having the sufficient gap may be secured.

As shown in FIG. 2, in the module substrate 110 of the semiconductor memory module 100, the thickness d1 of the first region 110*a* where the semiconductor devices 150 may be mounted may be thinner than the thickness d2 of the second region 110*b* where the external terminals 170 may be arranged.

As shown in FIGS. 4A to 4C, the semiconductor memory module 100 may include the semiconductor devices 150 having the reduced thickness. The semiconductor chip 152 as a part of the semiconductor devices 150 may be exposed. The part of the semiconductor devices 150 may include at least one of the memory component 150*a* and the driving component 150*b*. In an embodiment, at least one of the semiconductor devices 150 may have the reduced thickness by removing the molding layer on the semiconductor chip 153.

According to an embodiment, at least one of the module substrate and the semiconductor devices may have a thin thickness to manufacture the thin semiconductor memory module. Thus, although number of the semiconductor memory modules on the computer system may be increased, a sufficient gap through which a cooling fluid may flow may be secured between the semiconductor memory modules. As a result, a great amount of the semiconductor memory modules having desired performances may be mounted on a main board having a restricted area.

The above-described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A semiconductor memory module comprising:
a module substrate having a first surface and a second surface opposite to each other;
a plurality of semiconductor devices mounted on a first region of at least one of the first and second surfaces in the module substrate; and
a plurality of external terminals arranged in a second region of at least one of the first and second surfaces, the second region positioned at one side edge of the module substrate,
wherein a width of the module substrate corresponding to the first region is smaller than a width of the module substrate corresponding to distance between the first surface and the second surface in the first region is shorter than a distance between the first surface and the second surface in the second region.

2. The semiconductor memory module of claim 1, wherein each of the plurality of semiconductor devices comprises at least one memory component, and the memory component comprises at least one memory chip and a molding layer arranged on a side surface of the at least one memory chip to expose an uppermost memory chip.

3. The semiconductor memory module of claim 1, further comprising a heat dissipation plate attached to at least one of the first and second surfaces of the module substrate.

4. The semiconductor memory module of claim 1, wherein each of the plurality of semiconductor devices comprises a plurality of memory components including at least one semiconductor chip and at least one driving component including at least one semiconductor chip, and at least one temperature sensor to detect temperatures of the semiconductor devices.

5. The semiconductor memory module of claim 4, wherein the memory components and the driving component comprise a molding layer configured to surround side surfaces of the at least one semiconductor chip.

6. The semiconductor memory module of claim 1, wherein a semiconductor chip positioned at an uppermost portion of the semiconductor device is exposed,
further comprising a heat dissipation plate that directly contacts the exposed semiconductor chip positioned at the uppermost portion of the semiconductor device.

7. A semiconductor memory module comprising:
a module substrate including a package mounting region and a connecting region positioned at one side edge of the module substrate, wherein a thickness of the module substrate in the package mounting region is smaller than a thickness of the module substrate in the connecting region;
a plurality of semiconductor packages mounted on the package mounting region of the module substrate; and
a heat dissipation plate attached to the plurality of semiconductor packages.

8. The semiconductor memory module of claim 7, further comprising:
a plurality of first external terminals arranged on the connecting region of the module substrate.

9. The semiconductor memory module of claim 8, wherein the module substrate includes a first surface, a second surface facing the first surface, and a plurality of circuit patterns formed inside the module substrate to generate a plurality of conductive paths between the first surface and second surface, and
wherein a shortest conductive path in the package mounting region is shorter than a shortest conductive path in the connecting region.

10. The semiconductor memory module of claim 9, wherein the plurality of semiconductor packages are mounted on the first surface and second surface of the package mounting region, respectively, and
the heat dissipation plate is configured to cover the semiconductor packages mounted on at least one of the first and second surfaces of the module substrate.

11. The semiconductor memory module of claim 7, wherein each of the semiconductor packages comprises:
a package substrate;
a plurality of semiconductor chips disposed on the package substrate; and
a molding layer formed on the package substrate to surround side surfaces of the plurality of semiconductor chips,
wherein the molding layer is configured to expose an upper surface of a semiconductor chip positioned at an uppermost portion among the plurality of semiconductor chips, and the heat dissipation plate is directly contacted to the exposed upper surface of the semiconductor chip.

12. The semiconductor memory module of claim 11, wherein the semiconductor chip positioned at the uppermost portion includes a memory chip.

13. A computer system comprising:
a central processing unit (CPU) mounted on a main board;
a plurality of module connectors installed at the CPU; and
a thin semiconductor memory module including a module substrate, a plurality of semiconductor devices mounted on a first region of the module substrate, and a plurality of external terminals arranged at a second region of the module substrate, wherein the plurality of external terminals are connected to each of the plurality of module connectors, and wherein a thickness of the first region of the module substrate is thinner than a thickness of the second region of the module substrate.

14. The computer system of claim 13, wherein each of the plurality of semiconductor devices comprises:

a package substrate mounted on the module substrate;

at least one semiconductor chip bonded to the package substrate; and a molding layer formed on the package substrate to surround side surfaces of the semiconductor chip, the molding layer configured to expose an upper surface of the at least one semiconductor chip.

15. The computer system of claim 14, wherein each of the thin semiconductor memory modules further comprises a heat dissipation plate configured to physically contact the semiconductor devices on a same plane.

16. The computer system of claim 14, wherein the module substrate has a first surface and a second surface, and the plurality of semiconductor devices are mounted on at least one of the first and second surfaces of the module substrate.

17. The computer system of claim 16, wherein each of the thin semiconductor memory modules further comprises:

a first heat dissipation plate configured to physically contact the semiconductor devices mounted on the first surface of the module substrate, and a second heat dissipation plate configured to physically contact the plurality of semiconductor devices mounted on the second surface of the module substrate.

18. The computer system of claim 13, wherein a gap between the thin semiconductor memory modules on the module connectors is greater than a half of a width of the thin semiconductor memory modules.

* * * * *